United States Patent
Matsuoka et al.

(10) Patent No.: US 11,883,925 B2
(45) Date of Patent: Jan. 30, 2024

(54) POLISHING PAD AND METHOD FOR MANUFACTURING SAME

(71) Applicant: Fujibo Holdings, Inc., Tokyo (JP)

(72) Inventors: Ryuma Matsuoka, Saijo (JP); Hiroshi Kurihara, Saijo (JP); Satsuki Narushima, Saijo (JP); Yamato Takamizawa, Saijo (JP)

(73) Assignee: FUJIBO HOLDINGS, INC., Tokyo (JP)

( * ) Notice: Subject to any disclaimer, the term of this patent is extended or adjusted under 35 U.S.C. 154(b) by 795 days.

(21) Appl. No.: 17/040,638

(22) PCT Filed: Mar. 19, 2019

(86) PCT No.: PCT/JP2019/011405
§ 371 (c)(1),
(2) Date: Sep. 23, 2020

(87) PCT Pub. No.: WO2019/188577
PCT Pub. Date: Oct. 3, 2019

(65) Prior Publication Data
US 2021/0114166 A1    Apr. 22, 2021

(30) Foreign Application Priority Data
Mar. 30, 2018  (JP) .................. 2018-066808

(51) Int. Cl.
*B24B 37/24*  (2012.01)
(52) U.S. Cl.
CPC .................. *B24B 37/24* (2013.01)
(58) Field of Classification Search
CPC ........ B24B 37/24; C08G 18/10; C08G 18/38; C08G 18/48; C08G 18/76; H01L 21/304; H01L 21/67092
See application file for complete search history.

(56) References Cited

U.S. PATENT DOCUMENTS

| | | |
|---|---|---|
| 6,454,634 B1 | 9/2002 | James et al. |
| 6,736,709 B1 | 5/2004 | James et al. |

(Continued)

FOREIGN PATENT DOCUMENTS

| | | |
|---|---|---|
| JP | 2004507076 A | 3/2004 |
| JP | 2004165408 A | 6/2004 |

(Continued)

OTHER PUBLICATIONS

Machine Translation of JP 2010082708 from Search (Year: 2023).*

(Continued)

*Primary Examiner* — Alexandra M Moore
(74) *Attorney, Agent, or Firm* — BUCHANAN INGERSOLL & ROONEY PC

(57) ABSTRACT

A polishing pad is equipped with a polishing layer having a polyurethane sheet, wherein a tan δ peak value change rate determined by formula: tan δ peak value change rate=|tan δ peak$_{wet}$−tan δ peak$_{dry}$|/tan δ peak$_{dry}$×100, is not more than 15%, where tan δ peak$_{wet}$ represents the peak value of the loss tangent tan δ, of the polyurethane sheet in a wet state after being immersed in water for three days, within a temperature range of 20-100° C. in a tensile mode under an initial load of 148 g with a strain range of 0.1% at a measurement frequency of 1.6 Hz, and tan δ peak$_{dry}$ represents the peak value of the loss tangent tan δ, of the polyurethane sheet in a dry state without being immersed in water, within a temperature range of 20-100° C. in a tensile mode under an initial load of 148 g with a strain range of 0.1% at a measurement frequency of 1.6 Hz.

15 Claims, 3 Drawing Sheets

(56) References Cited

U.S. PATENT DOCUMENTS

| | | |
|---|---|---|
| 6,749,485 B1 | 6/2004 | James et al. |
| 6,860,802 B1 | 3/2005 | Vishwanathan et al. |
| 10,195,714 B2 | 2/2019 | Itoyama et al. |
| 2003/0027500 A1 | 2/2003 | James et al. |
| 2005/0020082 A1 | 1/2005 | Vishwanathan et al. |
| 2005/0079806 A1 | 4/2005 | James et al. |
| 2017/0014970 A1* | 1/2017 | Itoyama ............. C08G 18/6674 |

FOREIGN PATENT DOCUMENTS

| | | | |
|---|---|---|---|
| JP | 2005136400 A | | 5/2005 |
| JP | 2010082708 A | * | 4/2010 |
| JP | 2015-193057 A | | 11/2015 |
| JP | 2016196057 A | | 11/2016 |
| WO | WO-0191971 A1 * | 12/2001 | ........... B24B 37/042 |

OTHER PUBLICATIONS

International Search Report (PCT/ISA/210) and an English translation thereof, and Written Opinion (PCT/ISA/237) dated Jun. 11, 2019, by the Japanese Patent Office as the International Searching Authority for International Application No. PCT/JP2019/011405.
Office Action dated Feb. 28, 2022, by the China National Intellectual Property Administration in corresponding Chinese Patent Application No. 201980023988.4 and a partial English translation of the Office Action. (20 pages).

* cited by examiner

EXAMPLE 1 ◆：DRY ×：WET

EXAMPLE 2 ◆：DRY ×：WET

POLISHING PAD AND METHOD FOR MANUFACTURING SAME

TECHNICAL FIELD

The present invention relates to a polishing pad and a method for manufacturing the same. In particular, the present invention relates to a polishing pad for chemical mechanical polishing (CMP) processing on optical materials, semiconductor wafers, semiconductor devices, substrates for hard disks, and so on, and a method for manufacturing the same.

BACKGROUND ART

Since the surfaces of materials such as silicon, substrates for hard disks, mother glasses for thin liquid crystal displays, semiconductor wafers, and semiconductor devices are required to be flat, the surfaces are polished by a free-abrasive grain polishing scheme using polishing pads. The free-abrasive grain polishing scheme is a method for polishing a surface of a workpiece (an object to be polished) while supplying a polishing liquid (polishing slurry) between the polishing pad and the workpiece.

In the polishing pad for semiconductor devices, the polishing pad surface is required to have pores for holding a polishing slurry, hardness for maintaining the flatness of semiconductor device surfaces, and elasticity for preventing scratches on the semiconductor device surfaces. As the polishing pad that meets these requirements, used are polishing pads each having a polishing layer manufactured of a urethane resin foam.

The urethane resin foam is usually formed by a curing reaction of a prepolymer containing a polyurethane bond-containing isocyanate compound with a curing agent (dry method). Then, this foam is sliced into a sheet, thereby forming a polishing pad. In a polishing pad with a hard polishing layer formed by the dry method as described above, relatively small, substantially spherical cells are formed inside the foam during urethane resin curing molding. Thus, pores (openings) that can hold a slurry during polishing are formed on the polishing surface of the polishing pad formed by slicing.

Heretofore, it is known to use, as indexes indicating the features of a polishing pad, values of a storage elastic modulus (E') measured by a dynamic viscoelasticity test (DMA: dynamic mechanical analysis), KEL, and the like (Patent Literatures 1 and 2).

Patent Literature 1 discloses a polishing pad in which a storage elastic modulus (E') measured by DMA, a 30° C./90° C. ratio of the storage elastic modulus, an energy loss factor (KEL), and so on are set within specific ranges in order to reduce the dishing of semiconductor devices. Patent Literature 2 discloses a polishing pad that achieves planarization performance and low defect performance in such a way that KEL and E at a frequency different from that of Patent Literature 1 (Patent Literature 1: 10 radians/sec, and Patent Literature 2: 1 radians/sec) are set within specific ranges. As polishing pads satisfying these indexes, for example, IC1000 (registered trademark, manufactured by Nitta Haas Incorporated) and the like are known.

CITATION LIST

Patent Literatures

Patent Literature 1: Japanese Unexamined Patent Application Publication (Translation of PCT Application) No. 2004-507076

Patent Literature 2: Japanese Unexamined Patent Application Publication No. 2005-136400

SUMMARY OF INVENTION

Problems to be Solved by the Invention

However, when polishing workpieces, the polishing pads described in Patent Literatures 1 and 2 listed above entail a great variation in polishing rate among the 10th, 20th, and 30th workpieces and therefore have a problem that the polishing rate is not stable over time.

The present invention was made in view of the aforementioned problem, and has an object to provide a polishing pad achieving high stability of a polishing rate over time and a method for manufacturing the same.

Means for Solution of the Problems

As a result of earnest studies, the present inventor has found that a polishing pad having high stability of the polishing rate over time can be obtained by achieving a low rate of change in a tan δ peak value of a polyurethane sheet between a dry state and a wet state. The present invention achieving the aforementioned object includes the following aspects.

[1] A polishing pad comprising a polishing layer including a polyurethane sheet, wherein a rate of change in a tan δ peak value calculated in accordance with the following equation between a loss tangent tan δ peak value (a tan δ peak$_{wet}$) within a temperature range of 20° C. to 100° C. of the polyurethane sheet in a wet state after immersion in a water bath for 3 days in a tensile mode with an initial load of 148 g, a strain range of 0.1%, and a measurement frequency of 1.6 Hz, and a loss tangent tan δ peak value (a tan δ peak$_{dry}$) within a temperature range of 20° C. to 100° C. of the polyurethane sheet in a dry state without immersion in the water bath in a tensile mode with an initial load of 148 g, a strain range of 0.1%, and a measurement frequency of 1.6 Hz is 15% or less:

Rate of change in tan δ peak value=|tan δ peak$_{wet}$−tan δ peak$_{dry}$|/tan δ peak$_{dry}$×100.

[2] The polishing pad according to [1], wherein a rate of change in a storage elastic modulus calculated in accordance with the following equation between a storage elastic modulus (E'$_{wet}$) of the polyurethane sheet in the wet state at 40° C. in a tensile mode with an initial load of 148 g, a strain range of 0.1%, and a measurement frequency of 1.6 Hz, and a storage elastic modulus (E'$_{dry}$) of the polyurethane sheet in the dry state at 40° C. in a tensile mode with an initial load of 148 g, a strain range of 0.1%, and a measurement frequency of 1.6 Hz is 32% or less:

Rate of change in storage elastic modulus=|E'$_{wet}$−E'$_{dry}$|/E'$_{dry}$×100.

[3] The polishing pad according to [1] or [2], wherein a tan δ peak temperature of the polyurethane sheet in the wet state within a temperature range of 20° C. to 100° C. in a tensile mode with an initial load of 148 g, a strain range of 0.1%, and a measurement frequency of 1.6 Hz is 60 to 100° C., and a tan δ peak temperature of the polyurethane sheet in the dry state within a temperature range of 20° C. to 100° C. in a tensile mode with an initial load of 148 g, a strain range of 0.1%, and a measurement frequency of 1.6 Hz is 60 to 100° C.

[4] The polishing pad according to any one of [1] to [3], wherein the rate of change in the tan δ peak value is 5% or less.

[5] The polishing pad according to any one of [1] to [4], wherein the tan δ peak value of the polyurethane sheet in the wet state is 0.10 to 0.20 and the tan δ peak value of the polyurethane sheet in the dry state is 0.10 to 0.20.

[6] The polishing pad according to any one of [1] to [5], wherein the polyurethane sheet includes hollow bodies with an average particle diameter of 10 to 150

[7] A polishing pad comprising a polishing layer including a polyurethane sheet, wherein a rate of change in a storage elastic modulus calculated in accordance with the following equation between a storage elastic modulus ($E'_{wet}$) at 40° C. of the polyurethane sheet in a wet state after immersion in a water bath for 3 days in a tensile mode with an initial load of 148 g, a strain range of 0.1%, and a measurement frequency of 1.6 Hz, and a storage elastic modulus ($E'_{dry}$) at 40° C. of the polyurethane sheet in a dry state without immersion in the water bath in a tensile mode with an initial load of 148 g, a strain range of 0.1%, and a measurement frequency of 1.6 Hz is 32% or less:

Rate of change in storage elastic modulus=$|E'_{wet}-E'_{dry}|/E'_{dry} \times 100$.

[8] A method for manufacturing the polishing pad according to any one of [1] to [7], comprising the steps of:
mixing a polyurethane bond-containing isocyanate compound (A) as a prepolymer and a curing agent (D) to obtain a mixture liquid for molded products; and
molding a polyurethane resin molded product from the mixture liquid for molded products to obtain a polyurethane sheet.

[9] The method according to [8], wherein the prepolymer comprises 2,6-tolylene diisocyanate (2,6-TDI) and/or 2,4-tolylene diisocyanate (2,4-TDI) as a constituent ingredient, and is free of diphenylmethane-4,4'-diisocyanate (MDI).

[10] The method according to [8] or [9], wherein a NCO equivalent of the prepolymer is 440 to 480.

[11] The method according to any one of [8] to [10], wherein the curing agent comprises 3,3'-dichloro-4,4'-diaminodiphenylmethane and/or polypropylene glycol.

Advantageous Effects of Invention

According to the present invention, it is possible to obtain a polishing pad having high stability of a polishing rate over time. In addition, according to the present invention, it is possible to obtain a polishing pad achieving a good polishing rate.

BRIEF DESCRIPTION OF DRAWINGS

In FIG. 1, black diamond symbols indicate values of E', E", and tan δ of the polishing pad in the dry state, whereas cross symbols indicate values of E', E", and tan δ of the polishing pad in the wet state.

In FIG. 2, black diamond symbols indicate values of E', E", and tan δ of the polishing pad in the dry state, whereas cross symbols indicate values of E', E", and tan δ of the polishing pad in the wet state.

In FIG. 3, black diamond symbols indicate values of E', E", and tan δ of the polishing pad in the dry state, whereas cross symbols indicate values of E', E", and tan δ of the polishing pad in the wet state.

In FIG. 4, black diamond symbols indicate values of E', E", and tan δ of the polishing pad in the dry state, whereas cross symbols indicate values of E', E", and tan δ of the polishing pad in the wet state.

DESCRIPTION OF EMBODIMENTS

Figure 1:
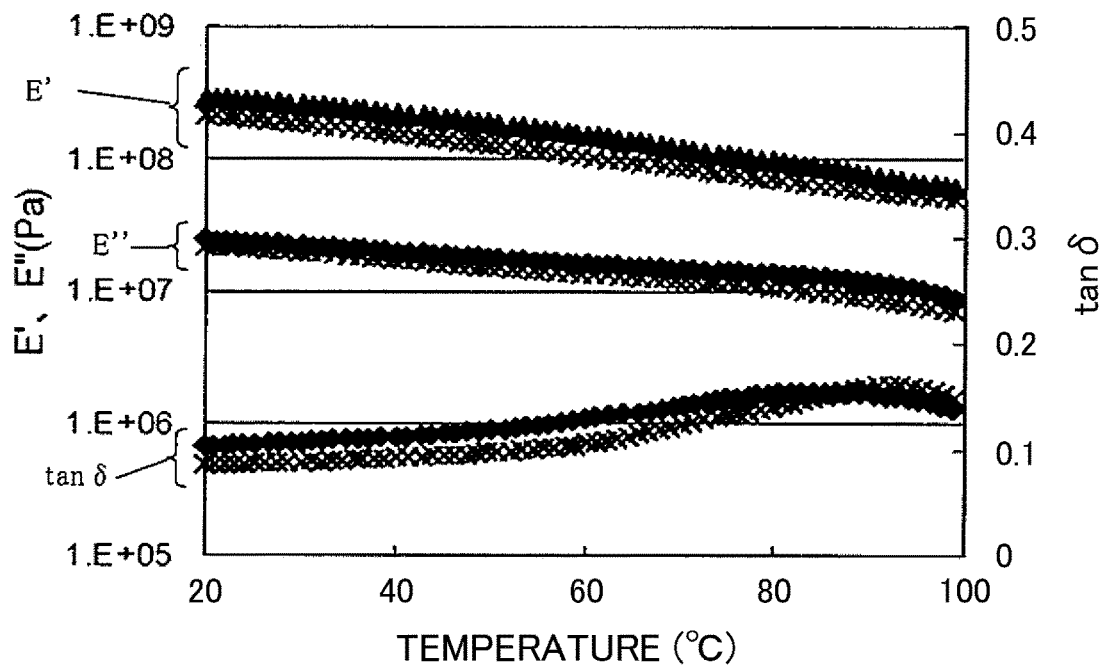
FIG. 1 is a diagram demonstrating a storage elastic modulus E', a loss elastic modulus E", and tan δ at 20 to 100° C. of each of polishing pads (polyurethane sheets) in a dry state and a wet state in Example 1.
Figure 2:
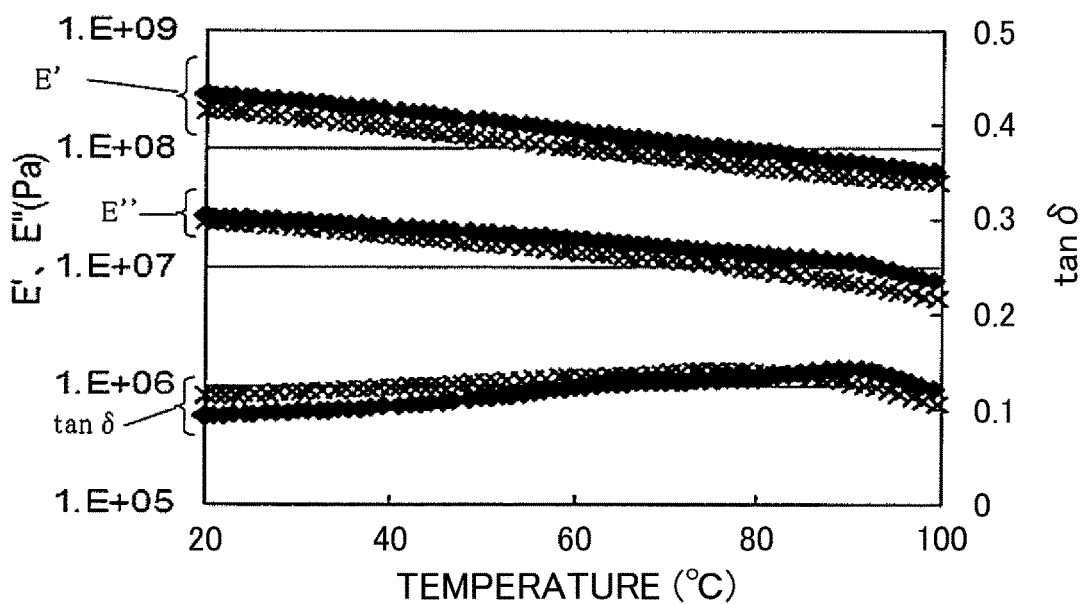
FIG. 2 is a diagram demonstrating a storage elastic modulus E', a loss elastic modulus E", and tan δ at 20 to 100° C. of each of polishing pads (polyurethane sheets) in a dry state and a wet state in Example 2.
Figure 3:
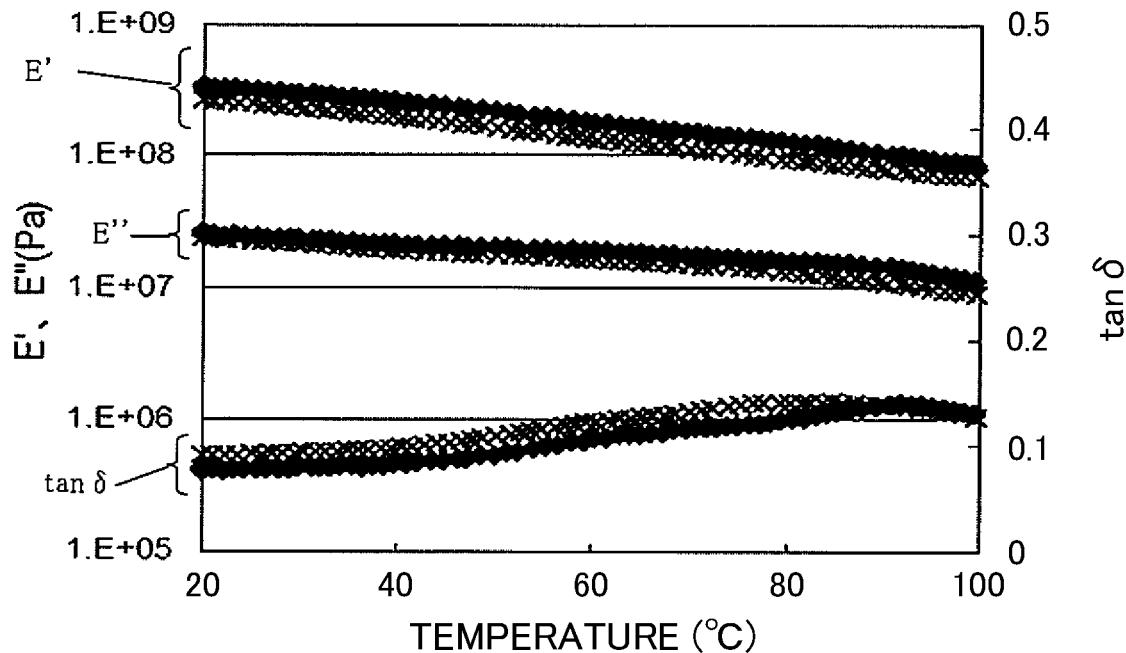
FIG. 3 is a diagram demonstrating a storage elastic modulus E', a loss elastic modulus E", and tan δ at 20 to 100° C. of each of polishing pads (polyurethane sheets) in a dry state and a wet state in Example 3.
Figure 4:
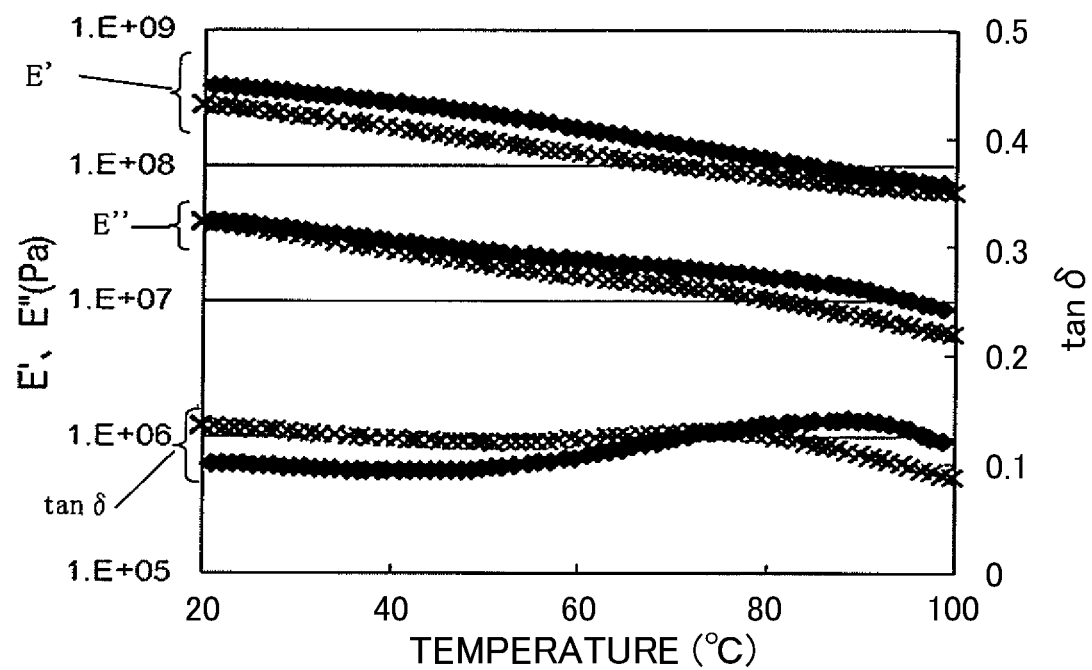
FIG. 4 is a diagram demonstrating a storage elastic modulus E', a loss elastic modulus E", and tan δ at 20 to 100° C. of each of polishing pads (polyurethane sheets) in a dry state and a wet state in Comparative Example 1.

Hereinafter, embodiments for carrying out the present invention will be described.
<<Polishing Pad>>

A polishing pad in a first aspect of the present invention is a polishing pad comprising a polishing layer including a polyurethane sheet, wherein a rate of change in a tan δ peak value calculated in accordance with the following equation between a loss tangent tan δ peak value (a tan δ $peak_{wet}$) within a temperature range of 20° C. to 100° C. of the polyurethane sheet in a wet state after immersion in a water bath for 3 days in a tensile mode with an initial load of 148 g, a strain range of 0.1%, and a measurement frequency of 1.6 Hz, and a loss tangent tan δ peak value (a tan δ $peak_{dry}$) within a temperature range of 20° C. to 100° C. of the polyurethane sheet in a dry state without immersion in the water bath in a tensile mode with an initial load of 148 g, a strain range of 0.1%, and a measurement frequency of 1.6 Hz is 15% or less:

Rate of change in tan δ peak value=$|$tan δ $peak_{wet}-$tan δ $peak_{dry}|/$tan δ $peak_{dry} \times 100$.

A polishing pad in a second aspect of the present invention is a polishing pad comprising a polishing layer including a polyurethane sheet, wherein a rate of change in a storage elastic modulus calculated in accordance with the following equation between a storage elastic modulus ($E'_{wet}$) at 40° C. of the polyurethane sheet in a wet state after immersion in a water bath for 3 days in a tensile mode with an initial load of 148 g, a strain range of 0.1%, and a measurement frequency of 1.6 Hz, and a storage elastic modulus ($E'_{dry}$) at 40° C. of the polyurethane sheet in a dry state without immersion in the water bath in a tensile mode with an initial load of 148 g, a strain range of 0.1%, and a measurement frequency of 1.6 Hz is 32% or less:

Rate of change in storage elastic modulus=$|E'_{wet}-E'_{dry}|/E'_{dry} \times 100$.

(Definitions)

In the present specification and claims, the storage elastic modulus (E') and the loss elastic modulus (E") are defined respectively as a storage elastic modulus and a loss elastic modulus in conformity with JIS K7244-4 at a predetermined temperature in a tensile mode with an initial load of 148 g, a strain range of 0.1%, and a measurement frequency of 1.6 Hz.

In the present specification and claims, tan δ is a ratio of the loss elastic modulus to the storage elastic modulus, and is defined as follows.

tan δ=E"/E'

The tan δ is an index of a viscoelasticity under a certain temperature condition. The storage elastic modulus is a measure of an energy that a foam stores and fully recovers per cycle under application of a sinusoidally varying stress. Meanwhile, the loss elastic modulus means the magnitude of a stress component obtained, when a sinusoidal strain at a characteristic frequency is applied, at a phase advanced by π/2 from the strain.

In the present specification and claims, a "polyurethane sheet in a wet state" means a polyurethane sheet after immersion in a water bath for 3 days. The polyurethane sheet in the wet state is taken out from the bath immediately before measurement of the storage elastic modulus and the loss elastic modulus (preferably taken out from the bath one minute or shorter before the measurement). The water bath temperature is not particularly limited as long as water can penetrate the polyurethane sheet by immersion in the water bath, but is preferably 10 to 40° C. and more preferably 15 to 25° C. In this regard, Examples and Comparative Example used a water bath adjusted to a temperature of 20±2° C.

In the present specification and claims, a "polyurethane sheet in a dry state" means a polyurethane sheet without immersion in the water bath. The polyurethane sheet in the dry state may be one stored in a room under an environment at a normal temperature (about 15 to 30° C.) and a usual humidity (relative humidity of 40 to 60%)). In this regard, Examples and Comparative Example used the polyurethane sheets stored for 50 hours or longer under an environment at 20±5° C. and a relative humidity of 50±10%.

(Rate of Change in tan δ Peak Value)

In the present specification and claims, a "tan δ peak value" means a tan δ value at a time when the tan δ value of the polyurethane sheet becomes greatest within a temperature range of 20° C. to 100° C. (at a rate of temperature rise of 5° C./min) in a tensile mode with an initial load of 148 g, a strain range of 0.1%, and a measurement frequency of 1.6 Hz. In general, the tan δ value of the polyurethane sheet increases up to a certain temperature, but decreases above that temperature. For this reason, the tan δ peak value exists.

The polishing pad of the present invention is preferably such that a rate of change in a tan δ peak value calculated in accordance with the following equation between a loss tangent tan δ peak value (a tan δ peak$_{wet}$) within a temperature range of 20° C. to 100° C. of the polyurethane sheet in a wet state after immersion in a water bath for 3 days in a tensile mode with an initial load of 148 g, a strain range of 0.1%, and a measurement frequency of 1.6 Hz, and a loss tangent tan δ peak value (a tan δ peak$_{dry}$) within a temperature range of 20° C. to 100° C. of the polyurethane sheet in a dry state without immersion in the water bath in a tensile mode with an initial load of 148 g, a strain range of 0.1%, and a measurement frequency of 1.6 Hz is 15% or less:

Rate of change in tan δ peak value=|tan δ peak$_{wet}$−
tan δ peak$_{dry}$|/tan δ peak$_{dry}$×100.

The rate of change in the tan δ peak value is more preferably 12% or less, further preferably 10% or less, even more preferably 8% or less, even more preferably 5% or less, even more preferably 4% or less, even more preferably 3% or less, even more preferably 2% or less, even more preferably 1.5% or less, and even more preferably 1.0% or less.

When the rate of change in the tan δ peak value is within the aforementioned range, the stability of the polishing rate over time can be enhanced. In addition, the polishing rate can be also improved. Moreover, the responsiveness to polishing pressure becomes high, so that the polishing rate according to the polishing pressure can be obtained.

In the polishing pad of the present invention, the tan δ peak value (tan δ peak$_{wet}$) of the polyurethane sheet in the wet state is preferably 0.10 to 0.20, more preferably 0.11 to 0.18, further preferably 0.12 to 0.18, even more preferably 0.12 to 0.16, and even more preferably 0.13 to 0.15. Meanwhile, the δ peak value (tan δ peak$_{wet}$) is also preferably 0.14 to 0.17.

In the polishing pad of the present invention, the tan δ peak value (tan δ peak$_{dry}$) of the polyurethane sheet in the dry state is preferably 0.10 to 0.20, more preferably 0.11 to 0.18, further preferably 0.12 to 0.18, even more preferably 0.12 to 0.16, and even more preferably 0.13 to 0.15. Meanwhile, the δ peak value (tan δ peak$_{dry}$) is also preferably 0.14 to 0.17.

(Tan δ Peak Temperature)

In the present specification and claims, a "tan δ peak temperature" means a temperature at which the tan δ value of the polyurethane sheet becomes greatest within a temperature range of 20° C. to 100° C. in a tensile mode with an initial load of 148 g, a strain range of 0.1%, and a measurement frequency of 1.6 Hz (that is, the temperature at which tan δ reaches the peak value). The tan δ value of the polyurethane sheet increases up to a certain temperature, but decreases above that temperature. For this reason, the tan δ peak temperature exists.

In the polishing pad of the present invention, the tan δ peak temperature (T$_{wet}$) of the polyurethane sheet in the wet state within a temperature range of 20° C. to 100° C. in a tensile mode with an initial load of 148 g, a strain range of 0.1%, and a measurement frequency of 1.6 Hz is preferably 60 to 100° C., more preferably 65 to 95° C., further preferably 70 to 95, even more preferably 70 to 90° C., even more preferably 75 to 90° C., and even more preferably 80 to 90° C.

In the polishing pad of the present invention, the tan δ peak temperature (T$_{dry}$) of the polyurethane sheet in the dry state within a temperature range of 20° C. to 100° C. in a tensile mode with an initial load of 148 g, a strain range of 0.1%, and a measurement frequency of 1.6 Hz is preferably 60 to 100° C., more preferably 65 to 95° C., further preferably 70 to 95, even more preferably 80 to 95° C., and even more preferably 85 to 95° C. Meanwhile, the tan δ peak temperature (T$_{dry}$) is also preferably 70 to 90° C.

(Storage Elastic Modulus (E'))

In the polishing pad of the present invention, when E'wet denotes the storage elastic modulus at 40° C. of the polyurethane sheet in the wet state in a tensile mode with an initial load of 148 g, a strain range of 0.1%, and a measurement frequency of 1.6 Hz, and E'$_{dry}$ denotes the storage elastic modulus at 40° C. of the polyurethane sheet in the dry state in a tensile mode with an initial load of 148 g, a strain range of 0.1%, and a measurement frequency of 1.6 Hz, the rate of change in the storage elastic modulus obtained by the following equation is preferably 32% or less, more preferably 30% or less, and further preferably 25% or less. When the rate of change in the storage elastic modulus is within the aforementioned range, it tends to be easier to obtain polishing pads achieving the high stability of the polishing rate over time.

$$\text{Storage elastic modulus change rate} = |E'_{wet} - E'_{dry}| / E'_{dry} \times 100$$

In the polishing pad of the present invention, the storage elastic modulus $E'_{wet}$ at 40° C. of the polyurethane sheet in the wet state in a tensile mode with an initial load of 148 g, a strain range of 0.1%, and a measurement frequency of 1.6 Hz is preferably 50 to 500 MP, more preferably 100 to 400 MPa, and further preferably 150 to 300 MPa.

In addition, in the polishing pad of the present invention, the storage elastic modulus $E'_{dry}$ at 40° C. of the polyurethane sheet in the dry state in a tensile mode with an initial load of 148 g, a strain range of 0.1%, and a measurement frequency of 1.6 Hz is preferably 100 to 1000 MPa, more preferably 150 to 800 MPa, further preferably 150 to 300 MPa, and even more preferably 200 to 400 MPa.

(Polyurethane Sheet)

The polyurethane sheet means a sheet-shaped resin containing at least two urethane bonds per molecule. The polyurethane sheet preferably contains at least two urethane bonds and at least two urea bonds per molecule. The polyurethane sheet of the present invention and the polishing pad containing the sheet can be manufactured, for example, in accordance with a manufacturing method of the present invention to be described later.

The polyurethane sheet of the present invention contains substantially spherical cells. The substantially spherical cells include substantially spherical cells derived from carbon dioxide generated during polyurethane sheet molding and/or spherical or substantially spherical cells derived from hollow bodies. The substantially spherical cells derived from carbon dioxide generated during polyurethane sheet molding indicate a concept meaning cells in a general shape (a shape which is isotropic, and is spherical, elliptical, or close to any of these shapes) present in molded products and polyurethane sheets molded by the dry method and are used for discrimination from a cell shape (an anisotropic shape in which the diameter becomes larger from the front surface toward the bottom portion of the polishing layer in the polishing pad) contained in molded products formed by the wet method. Therefore, the polyurethane sheet of the present invention may be rephrased as a polyurethane sheet containing substantially spherical cells or a polyurethane sheet molded by the dry method. Further, the polyurethane sheet of the present invention can be rephrased as a sheet-shaped urethane resin foam or a foamed polyurethane sheet.

(Hollow Body)

In the present specification and claims, the hollow body means a substantially spherical microsphere having a cavity. The substantially spherical microspheres include those in spherical, elliptical, and similar shapes. An example of the hollow body is one obtained by thermally expanding an unexpanded heat-expandable microsphere including a thermoplastic resin outer shell (polymer shell) and a low boiling point hydrocarbon contained in the outer shell.

As the polymer shell, it is possible to use, for example, a thermoplastic resin such as an acrylonitrile-vinylidene chloride copolymer, an acrylonitrile-methyl methacrylate copolymer, or a vinyl chloride-ethylene copolymer as disclosed in Japanese Patent Application Publication No. S57-137323 and others. Similarly, as the low boiling point hydrocarbon contained in the polymer shell, it is possible to use, for example, isobutane, pentane, isopentane, petroleum ether, or the like.

In the polishing pad of the present invention, the polyurethane sheet preferably contains hollow bodies with an average particle diameter of 10 to 150 μm. The average particle diameter of the hollow bodies is more preferably 15 to 130 μm, further preferably 15 to 100 μm, even more preferably 20 to 100 μm, even more preferably 20 to 60 μm, even more preferably 20 to 50 μm, and particularly preferably 30 to 50 μm.

Containing the hollow bodies, the polyurethane sheet is capable of holding a polishing slurry during polishing, and thereby contributing to the polishing of the workpiece.

Here, the average particle diameter can be measured by a laser diffraction particle size distribution measuring apparatus (for example, Mastersizer 2000 manufactured by Spectris company).

(Thickness) In the polishing pad of the present invention, the thickness of the polyurethane sheet is not particularly limited, but the polyurethane sheet may be used with a thickness in a range of, for example, 0.5 to 3.0 mm, preferably 0.5 to 2.0 mm, and more preferably 1.0 to 1.5 mm.

(Constituent Ingredients of Polyurethane Sheet)

In the present specification and claims, the constituent ingredients of the polyurethane sheet mean raw material ingredients for a polyurethane resin, which will be incorporated by a subsequent polymerization reaction as part of chains constituting the polyurethane resin.

The constituent ingredients of the polyurethane resin constituting the polyurethane sheet in the polishing pad of the present invention include raw materials for the polyurethane resin, namely, a polyisocyanate ingredient, a polyol ingredient, and a polyamine ingredient as an optional ingredient. Examples of the polyisocyanate ingredient include (B) polyisocyanate compound to be described later. Examples of the polyol compound include (C) polyol compound and (D-2) polyol compound optionally usable after prepolymer synthesis. Examples of the polyamine ingredient include (D-1) polyamine compound.

The polyurethane sheet in the polishing pad of the present invention preferably contains 2,4-tolylene diisocyanate (2,4-TDI) and/or 2,6-tolylene diisocyanate (2,6-TDI) as the polyisocyanate ingredient constituting the polyurethane resin, and more preferably contains 2,4-TDI and 2,6-TDI. The mass ratio of 2,4-TDI to 2,6-TDI is preferably 100:0 to 50:50, more preferably 90:10 to 60:40, further preferably 90:10 to 70:30, and even more preferably 80:20.

In addition, the polyurethane sheet in the polishing pad of the present invention may or may not contain diphenylmethane-4,4'-diisocyanate (MDI) as a polyisocyanate ingredient constituting the polyurethane resin, but the polyurethane sheet is preferably free of diphenylmethane-4,4'-diisocyanate (MDI).

Moreover, the polyurethane sheet in the polishing pad of the present invention preferably contains, as the polyol ingredient constituting the polyurethane resin, poly(oxytetramethylene) glycol with a number average molecular mass of 500 to 1500. The poly(oxytetramethylene) glycol more preferably has a number average molecular mass of 600 to 1300, and even more preferably 650 to 1000. In addition, the polyurethane sheet in the polishing pad of the present invention preferably contains polypropylene glycol as the polyol ingredient constituting the polyurethane resin, more preferably contains polypropylene glycol with a number average molecular mass of 1000 to 3000, and further preferably contains polypropylene glycol with a number average molecular mass of 1500 to 2500.

Further, the polyurethane sheet in the polishing pad of the present invention preferably contains, as the polyamine ingredient constituting the polyurethane resin, dicyclohexylmethane-4,4'-diamine or 3,3'-dichloro-4,4'-diaminodiphenylmethane (methylenebis-o-chloroaniline) (abbreviated as: MOCA).

The polishing pad of the present invention is used for polishing optical materials, semiconductor wafers, semiconductor devices, substrates for hard disks, and the like, and is particularly favorably used for chemical-mechanical polishing (CMP) of devices in which an oxide layer and a metal layer, such as copper, are formed on a semiconductor wafer.

The polishing pad of the present invention may be obtained in accordance with the following manufacturing method.

<<Method for Manufacturing a Polishing Pad>>

The manufacturing method of the present invention includes a step (mixing step) of mixing a polyurethane bond-containing isocyanate compound (A) as a prepolymer and a curing agent (D) to obtain a mixture liquid for molded products; and a step (molding step) of molding a polyurethane resin molded product from the mixture liquid for molded products to obtain a polyurethane sheet.

Hereinafter, the steps will be described.

<Mixing Step>

In the mixing step, at least a polyurethane bond-containing isocyanate compound (A) and a curing agent (D) as raw materials for a polyurethane sheet are mixed. In addition, ingredients other than the above two may be used in combination as long as the effects of the invention will not be impaired.

Hereinafter, the ingredients will be described.

[(A) Polyurethane Bond-Containing Isocyanate Compound]

The polyurethane bond-containing isocyanate compound (A) (hereinafter, also referred to as ingredient (A)) as the prepolymer is a compound obtained by a reaction of a polyisocyanate compound (B) and a polyol compound (C) described below under generally-used conditions, and contains a polyurethane bond and an isocyanate group per molecule. In addition, other ingredients may be contained in the polyurethane bond-containing isocyanate compound as long as the effects of the invention will not be impaired.

As the polyurethane bond-containing isocyanate compound (A), it is possible to use commercially available one, or use one synthesized by a reaction of a polyisocyanate compound and a polyol compound. The above reaction is not particularly limited, and an addition polymerization reaction may be performed by using a method and conditions known in the manufacturing of polyurethane resins. For example, the manufacturing may be performed in a method in which a polyisocyanate compound heated at 50° C. is added to a polyol compound heated at 40° C. in a nitrogen atmosphere with stirring, and then the resultant mixture is heated to 80° C. after 30 minutes and is subjected to the reaction at 80° C. further for 60 minutes.

[(B) Polyisocyanate Compound]

In the present specification and claims, the polyisocyanate compound means a compound containing two or more isocyanate groups per molecule.

The polyisocyanate compound (B) is not particularly limited, as long as the compound contains two or more isocyanate groups per molecule. Examples of a diisocyanate compound containing two isocyanate groups per molecule include m-phenylene diisocyanate, p-phenylene diisocyanate, 2,6-tolylene diisocyanate (2,6-TDI), 2,4-tolylene diisocyanate (2,4-TDI), naphthalene-1,4-diisocyanate, diphenylmethane-4,4'-diisocyanate (MDI), 4,4'-methylene-bis(cyclohexyl isocyanate) (hydrogenated MDI), 3,3'-dimethoxy-4,4'-biphenyldiisocyanate, 3,3'-dimethyldiphenylmethane-4,4'-diisocyanate, xylylene-1,4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,4-diisocyanate, p-phenylene diisothiocyanate, xylylene-1,4-diisothiocyanate, ethylidyne diisothiocyanate, and the like.

As the polyisocyanate compound, diisocyanate compounds are preferable. Among them, 2,4-TDI, 2,6-TDI, and MDI are more preferable and 2,4-TDI and 2,6-TDI are particularly preferable.

Any one of these polyisocyanate compounds may be used alone or two or more polyisocyanate compounds may be used in combination.

The polyisocyanate compound preferably contains 2,4-tolylene diisocyanate (2,4-TDI) and/or 2,6-tolylene diisocyanate (2,6-TDI) and more preferably contains 2,4-TDI and 2,6-TDI. The polyisocyanate compound further preferably consists of 2,4-TDI and 2,6-TDI. The mass ratio of 2,4-TDI to 2,6-TDI is preferably 100:0 to 50:50, more preferably 90:10 to 60:40, further preferably 90:10 to 70:30, and even more preferably 80:20.

The polyisocyanate compound may or may not contain diphenylmethane-4,4'-diisocyanate (MDI), but the polyisocyanate compound is preferably free of diphenylmethane-4,4'-diisocyanate (MDI).

[(C) Polyol Compound]

In the present specification and claims, the polyol compound means a compound having two or more alcoholic hydroxyl groups (OH) per molecule.

Examples of the polyol compound (C) for use to synthesize the polyurethane bond-containing isocyanate compound as the prepolymer include diol compounds such as ethylene glycol, diethylene glycol (DEG), and butylene glycol; triol compounds; polyether polyol compounds such as polypropylene glycol (PPG) and poly(oxytetramethylene) glycol (PTMG); polyester polyol compounds such as a reaction product of ethylene glycol and adipic acid and a reaction product of butylene glycol and adipic acid; polycarbonate polyol compounds, polycaprolactone polyol compounds, and the like. In addition, it is possible to use trifunctional propylene glycol to which ethylene oxide is added. Among them, PTMG is preferable and a combination use of PTMG and DEG is also preferable.

The number average molecular mass (Mn) of PTMG is preferably 500 to 2000, more preferably 600 to 1300, and further preferably 650 to 1000. The number average molecular mass can be measured by gel permeation chromatography (GPC). Here, in the case of measuring the number average molecular mass of the polyol compound from the polyurethane resin, the polyurethane resin may be decomposed into the ingredients in a usual method such as amine decomposition, and thereafter the estimation may be carried out by GPC.

Any one of the above first polyol compounds (C) may be used alone or two or more polyol compounds may be used in combination.

(NCO Equivalent of Prepolymer)

In addition, the NCO equivalent of the prepolymer calculated in accordance with "(parts by mass of a polyisocyanate compound (B)+parts by mass of a polyol compound (C))/[(the number of functional groups per molecule of the polyisocyanate compound (B)×parts by mass of the polyisocyanate compound (B)/a molecular mass of the polyisocyanate compound (B))−(the number of functional groups per molecule of the polyol compound (C)×parts by mass of the polyol compound (C)/a molecular mass of the polyol compound (C))]" is a numerical value indicating the molecular mass of PP (prepolymer) per NCO group. The NCO equivalent is preferably 200 to 800, more preferably 300 to 700, further preferably 300 to 600, even more preferably 350 to 600, even more preferably 400 to 500, and particularly preferably 400 to 450.

[(D) Curing Agent]

In the manufacturing method of the present invention, a curing agent (also referred to as a chain extender) is mixed with the polyurethane bond-containing isocyanate compound and so on in the mixing step. As a result of the addition of the curing agent, the ends of the main chain of the polyurethane bond-containing isocyanate compound as the prepolymer are bonded to the curing agent to form the polymer chain and the resultant polymer is cured in the subsequent molding step.

As the curing agent, for example, a polyamine compound and/or a polyol compound may be used.

The curing agent is preferably added in an amount of 10 to 60 parts by mass, more preferably 20 to 50 parts by mass, further preferably 20 to 40 parts by mass, and even more preferably 30 to 40 relative to 100 parts by mass of the prepolymer.

((D-1) Polyamine Compound)

In the present specification and claims, the polyamine compound means a compound containing two or more amino groups per molecule.

As the polyamine compound (D-1), an aliphatic or aromatic compound, or in particular, a diamine compound may be used and examples thereof include ethylenediamine, propylenediamine, hexamethylenediamine, isophoronediamine, dicyclohexylmethane-4,4'-diamine, 3,3'-dichloro-4,4'-diaminodiphenylmethane (methylenebis-o-chloroaniline) (hereinafter abbreviated as MOCA), polyamine compounds having a structure similar to that of MOCA, and so on. In addition, the polyamine compound may contain a hydroxy group, and examples of such amine-based compounds include 2-hydroxyethyl ethylene diamine, 2-hydroxyethyl propylene diamine, di-2-hydroxyethyl ethylene diamine, di-2-hydroxyethyl propylene diamine, 2-hydroxypropyl ethylene diamine, di-2-hydroxypropyl ethylene diamine, and the like.

As the polyamine compound, a diamine compound is preferable, MOCA, diaminodiphenylmethane, and diaminodiphenyl sulfone are more preferable, and MOCA is particularly preferable.

Any one of the polyamine compounds (D-1) may be used alone or two or more polyamine compounds (D-1) may be used in combination.

It is preferable to degas (defoam) the polyamine compound (D-1) under reduced pressure while being heated, as needed, in order to facilitate mixing with other ingredients and/or to improve the uniformity of cell diameters in the subsequent molding step. As the degassing (defoaming) method under reduced pressure, any method known in the polyurethane manufacturing may be used. For example, the degassing (defoaming) may be performed at a degree of vacuum of 0.1 MPa or below by using a vacuum pump.

In the case where a solid compound is used as the curing agent (chain extender), the compound may be degassed (defoamed) under reduced pressure while being melted by heating.

The polyamine compound (D-1) is preferably added in an amount of 10 to 50 parts by mass, more preferably 15 to 40 parts by mass, and further preferably 20 to 30 parts by mass relative to 100 parts by mass of the prepolymer.

((D-2) Polyol Compound Optionally Usable After Prepolymer Synthesis)

Moreover, in the present invention, a polyol compound (D-2) may be used as a curing agent, apart from the polyol compound (C) used to form the isocyanate group-containing compound as the prepolymer.

As the polyol compound (D-2), any polyol compounds such as diol compounds and triol compounds may be used without particular limitation. Here, the polyol compound (D-2) may be the same as or different from the polyol compound (C) used to form the prepolymer.

Specific examples thereof include low-molecular mass diols such as ethylene glycol, diethylene glycol, triethylene glycol, 1,2-propanediol, 1,3-propanediol, 1,3-butanediol, 1,4-butanediol, neopentyl glycol, pentanediol, 3-methyl-1,5-pentanediol, and 1,6-hexanediol; and high-molecular mass polyol compounds such as poly(oxytetramethylene) glycol, polyethylene glycol, and polypropylene glycol; and the like. Among them, polypropylene glycol is preferable, polypropylene glycol having a number average molecular mass of 1000 to 3000 is more preferable, and polypropylene glycol having a number average molecular mass of 1500 to 2500 is further preferable.

Any one of the above polyol compounds (D-2) may be used alone or two or more polyol compounds (D-2) may be used in combination.

The polyol compound (D-2) is preferably added in an amount of 0 to 15 parts by mass, more preferably 1 to 15 parts by mass, and further preferably 3 to 10 parts by mass relative to 100 parts by mass of the prepolymer.

As the curing agent (D), the polyamine compound (D-1) may be used, the polyol compound (D-2) may be used, or a mixture of them may be used. Among them, it is preferable to use the polyamine compound (D-1) and the polyol compound (D-2) in combination.

(R Value)

In the method for manufacturing the polishing pad of the present invention, it is preferable to mix the ingredients such that the R value, which is an equivalent ratio of active hydrogen groups (amino groups and hydroxyl groups) present in the curing agent (D) to isocyanate groups present at the ends in the polyurethane bond-containing isocyanate compound (A) as the prepolymer, is 0.70 to 1.30, more preferably 0.75 to 1.20, further preferably 0.80 to 1.10, even more preferably 0.80 to 1.00, and even more preferably 0.85 to 0.95. Also, the R value is preferably 0.70 to 1.10 or 0.75 to 1.00.

When the R value is within the above range, it tends to be easier to obtain polishing pads achieving the good polishing rate.

[(E) Hollow Bodies]

In the method for manufacturing the polishing pad of the present invention, it is preferable to use hollow bodies so that the polyurethane resin molded body contains substantially spherical cells.

As the hollow bodies, hollow bodies with an average particle diameter of 10 to 150 µm are preferably used. The average particle diameter of the hollow bodies is preferably 15 to 130 µm, more preferably 20 to 100 µm, further preferably 20 to 60 µm, and particularly preferably 30 to 50 µm.

Here, the average particle diameter can be measured by a laser diffraction particle size distribution measuring apparatus (for example, Mastersizer 2000 manufactured by Spectris company).

The hollow bodies are preferably added in an amount of 0.1 to 10 parts by mass, more preferably 1 to 5 parts by mass, and further preferably 1 to 3 parts by mass relative to 100 parts by mass of the prepolymer.

In addition to the aforementioned ingredients, a conventionally used blowing agent may be used in combination with the above spherical microspheres, or a gas which is not reactive with any of the above ingredients may be injected in the mixing step, as long as the effects of the invention will not be impaired. Examples of the blowing agent include water, and blowing agents containing a hydrocarbon having 5 or 6 carbon atoms as main ingredients. Examples of the hydrocarbon include chain hydrocarbons such as n-pentane and n-hexane, and alicyclic hydrocarbons such as cyclopentane and cyclohexane.

In addition to the above ingredients, any of known foam stabilizers, fire retardants, colorants, plasticizers and the like may be added.

In the mixing step, at least the polyurethane bond-containing isocyanate compound (A) as the prepolymer and the curing agent (D) are fed to a mixer and then are stirred and mixed. Instead, in the case where the hollow bodies (E) are contained, at least the polyurethane bond-containing isocyanate compound (A) as the prepolymer, the curing agent (D), and the hollow bodies (E) are fed to the mixer and then are stirred and mixed. The order of the ingredients in mixing is not particularly limited, but it is preferable to mix the polyurethane bond-containing isocyanate compound (A) and the hollow bodies first, and then feed the obtained mixture, the curing agent (D), and other ingredients as needed to the mixer. In this way, the mixture liquid for molded products is prepared. The mixing step is carried out with heating at a temperature at which the flowability of the ingredients can be ensured.

For example, it is possible to add the curing agent to the prepolymer (polyurethane bond-containing isocyanate) solution which is heated at 30° C. to 90° C. and which contains the hollow bodies in a temperature-controllable mixer with a jacket, and stir them at 30° C. to 130° C. If necessary, the mixture liquid may be put and aged in a tank equipped with a stirrer and a jacket. The stirring time is adjusted as appropriate depending on the number of teeth, a rotation speed, a clearance, and so on in the mixer, and is 0.1 to 60 seconds, for example.

<Molding Step>

In the molding step, the mixture liquid for molded products prepared in the mixing step is poured into a mold preheated at 30 to 100° C. and is cured by heating at about 100 to 150° C. for about 10 minutes to 5 hours, so that the polyurethane resin is molded. In this process, the prepolymer and the curing agent react with each other to form the polyurethane resin, so that the mixture liquid is cured with cells and/or hollow bodies dispersed in the resin. Thus, the polyurethane resin molded product containing a large number of substantially spherical cells is formed.

The polyurethane resin molded product obtained in the molding step is then sliced into a sheet, thereby forming a polyurethane sheet. The slicing forms pores on the surfaces of the sheet. In this process, aging may be performed at 30 to 150° C. for about 1 to 24 hours for the purpose of forming pores on the surface of the polishing layer that have good wear resistance and are less likely to clog.

Then, the polishing layer including the polyurethane sheet thus obtained is cut into a predetermined shape, preferably a disc shape, with a double-sided tape applied on the opposite surface of the polishing layer from the polishing surface and thus is completed as the polishing pad of the present invention. The double-sided tape is not particularly limited, but any one of double-sided tapes known in this technical field may be selected and used.

In addition, the polishing pad of the present invention may have a single-layer structure including only the polishing layer, or may have a multilayer structure in which another layer (under layer or supporting layer) is attached to the opposite surface of the polishing layer from the polishing surface. The properties of the other layer are not particularly limited. In this regard, when a layer softer (having a smaller A hardness or D hardness) than the polishing layer is attached to the opposite surface of the polishing layer, the polished flatness is further enhanced. On the other hand, when a layer harder (having a greater A hardness or D hardness) than the polishing layer is attached to the opposite surface of the polishing layer, the polishing rate is further enhanced.

In the case of having a multilayer structure, multiple layers are bonded and fixed together by using a double-sided tape or an adhesive agent, with application of pressure if necessary. The double-sided tape and the adhesive agent used in this case are not particularly limited. Any one of double-sided tapes and adhesive agents known in this technical field may be selected and used.

Moreover, if necessary, the polishing pad of the present invention may be subjected to a grinding treatment on the front surface and/or the back surface of the polishing layer, or grooving or embossing on the front surface. Moreover, a substrate and/or an adhesive layer may be laminated on the polishing layer, and the polishing layer may include a light-transmission portion.

The grinding method is not particularly limited, and any known method may be used for grinding. A specific method is grinding with sandpaper.

The pattern achieved by the grooving or embossing are not particularly limited, and examples thereof include a lattice pattern, a concentric-circular pattern, a radial pattern, and the like.

When the polishing pad of the present invention is used, the polishing pad is attached to a polishing platen of a polishing machine with the polishing surface of the polishing layer facing a workpiece. Then, the surface of the workpiece is polished by rotating the polishing platen while supplying a polishing slurry.

<Operation and Effects>

The polishing pad of the present invention achieves the good stability of the polishing rate over time. The reason is not clarified yet, but is presumed as follows.

It is considered that the surface of the polishing pad during polishing processing is partially heated to around the tan δ peak temperature of the polishing pad (about 70 to 95° C.) due to frictional heat. In the case of polishing a workpiece by using the polishing pad, the polishing slurry supplied makes the surface of the polishing pad wet, and then makes the inside of the polishing pad also wet as time advances. In the polishing pad of the present invention, the tan δ peak value at the peak temperature does not greatly change between the wet state and the dry state. As the numeric value of tan δ becomes greater, the viscosity increases more than the elasticity, which affects the polishing rate. However, the polishing pad of the present invention is considered to be capable of obtaining a stable polishing rate even if the time passes, because the tan δ value does not greatly change even when the inside of the polishing pad becomes wet as time advances.

EXAMPLES

Hereinafter, the invention will be described in detail by using Examples, but the present invention should not be limited to these Examples.

In Examples and Comparative Example, "parts" mean "parts by mass" unless otherwise noted.

Then, the NCO equivalent is a numeric value indicating a molecular mass of a prepolymer (PP) per NCO group calculated in accordance with "(a mass (parts) of a polyisocyanate compound (B)+a mass (parts) of a polyol compound (C))/[(the number of functional groups per molecule of the polyisocyanate compound (B)×the mass (parts) of the polyisocyanate compound (B)/a molecular mass of the isocyanate compound (B))−(the number of functional groups per molecule of the polyol compound (C)×the mass (parts) of the polyol compound (C)/a molecular mass of the polyol compound (C))]".

The R value is a numeric value indicating an equivalent ratio of active hydrogen groups (amino groups and hydroxyl groups) present in the curing agent (D) to isocyanate groups present at the ends in the prepolymer as described above.

Example 1

1.7 parts of expanded hollow microspheres (product name: EXPANCEL 551 DE40d42 (manufactured by Expancel)) with a particle size of 30 to 50 in each of which a shell was made of an acrylonitrile-vinylidene chloride copolymer and isobutane gas was contained in the shell was added to 100 parts of an isocyanate-terminated urethane prepolymer having a NCO equivalent of 437, which was obtained by reacting tolylene diisocyanate (a mixture of 80% by mass of 2,4-TDI and 20% by mass of 2,6-TDI), poly(oxytetramethylene) glycol (PTMG) having a molecular mass of 650, and diethylene glycol (DEG), and they were mixed to obtain a mixture liquid. The mixture liquid thus obtained was put in a first liquid tank and kept warm at 80° C. Then, 27 parts of 3,3'-dichloro-4,4'-diaminodiphenylmethane (MOCA) as the curing agent was kept warm at 120° C. in a second liquid tank separately from the first liquid. The liquids in the first liquid tank and the second liquid tank were poured into a mixer equipped with two inlet ports from the respective inlet ports such that the R value indicating the equivalent ratio between isocyanate in the prepolymer and amine in the curing agent was 0.90. The poured two liquids were injected with mixing and stirring into a mold of a molding machine preheated to 100° C., and then the mold was clamped, followed by heating at 110° C. for 30 minutes for primary curing. The molded product after the primary curing was demolded, and was subjected to secondary curing in an oven at 130° C. for 2 hours, so that the urethane molded product was obtained. The obtained urethane molded product was allowed to cool to 25° C., thereafter was heated again in the oven at 120° C. for 5 hours, and then was cut with a thickness of 1.3 mm to obtain a polishing pad (polyurethane sheet).

Example 2

A polishing pad was obtained using the same production method as in Example 1 except that the NCO equivalent of the isocyanate-terminated urethane prepolymer was set to 460 and 2.4 parts of the hollow microspheres and 25 parts of the MOCA were used relative to 100 parts of the isocyanate-terminated urethane prepolymer.

Example 3

A polishing pad was obtained using the same production method as in Example 1 except that polypropylene glycol (PPG) with a molecular mass of 2000 was used as a curing agent in addition to the MOCA, and 2.1 parts of the hollow microspheres, 26 parts of the MOCA, and 5 parts of the PPG were used relative to 100 parts of the isocyanate-terminated urethane prepolymer.

Comparative Example 1

In Comparative Example 1, IC1000 (product name, manufactured by Nitta Haas Incorporated) was used as the polishing pad.

Regarding the polishing pads obtained in Examples and Comparative Example described above, the polishing pads in the wet state after immersion in a water bath at 20±2° C. for 3 days and the polishing pads in the dry state without immersion in the water bath (in other words, polishing pads in the dry state after storage for 50 hours or longer at normal temperature (about 20±5° C.) and a relative humidity of about 50±10%) were prepared and used in the following tests. Here, as for the polishing pads in the wet state, the polishing pads immediately after being taken out from the water bath were used in the tests after the water on their surfaces was wiped off.

(Storage Elastic Modulus E', Loss Elastic Modulus E", and tan δ)

For the polishing pads in the wet state and the dry state in Examples and Comparative Example described above, the storage elastic modulus E' and the loss elastic modulus E" at 20° C. to 100° C. were measured and the loss tangent tan δ was calculated. In addition, the rate of change in the storage elastic modulus at 40° C. and the rate of change in the tan δ peak value between the polishing pads in the wet state and the dry state were calculated.

The storage elastic modulus (MPa) at 40° C. and the tan δ of each of test pieces of 4×0.5×0.125 mm in the dry state and the wet state were measured by RSAIII of TA Instrument Japan in accordance with JIS K7244-4 with an initial load of 148 g, a strain range of 0.1%, and a measurement frequency of 1.6 Hz.

Here, the detailed measurement conditions are as follows.
Measuring instrument: RSAIII of TA Instrument Japan
Test mode: tensile and temperature dispersion
Test piece: 4×0.5×0.125 cm
Frequency: 1.6 Hz
Initial load: 148 g
Temperature: 20 to 100° C.
Strain range: 0.1%
Rate of temperature rise: 5° C./min
The results are presented in FIGS. 1 to 4 and Table 1.

TABLE 1

| | Storage elastic modulus E' (40° C.) | | | Tan δ peak value | | | Tan δ peak temperature | |
|---|---|---|---|---|---|---|---|---|
| | Dry | Wet | Change Rate | Dry | Wet | Change Rate | Dry | Wet |
| Example 1 | 215 MPa | 154 MPa | 28.3% | 0.154 | 0.156 | 1.30% | 85.3° C. | 89.1° C. |
| Example 2 | 210 MPa | 150 MPa | 28.6% | 0.143 | 0.140 | 2.10% | 88.9° C. | 75.8° C. |
| Example 3 | 258 MPa | 196 MPa | 24.0% | 0.140 | 0.141 | 0.71% | 91.8° C. | 85.4° C. |

TABLE 1-continued

| | Storage elastic modulus E' (40° C.) | | | Tan δ peak value | | | Tan δ peak temperature | |
|---|---|---|---|---|---|---|---|---|
| | Dry | Wet | Change Rate | Dry | Wet | Change Rate | Dry | Wet |
| Comparative Example 1 | 292 MPa | 190 MPa | 34.9% | 0.157 | 0.129 | 17.83% | 84.4° C. | 76.6° C. |

In the above table, Dry and Wet in the storage elastic modulus E' (40° C.) mean $E'_{dry}$ and $E'_{wet}$, respectively, and Change Rate means a rate of change in the storage elastic modulus, Dry and Wet in the tan δ peak mean the tan δ $peak_{dry}$ and the tan δ $peak_{wet}$, respectively, and Change Rate thereof means a rate of change in the tan δ peak value, and Dry and Wet in the tan δ peak temperature mean $T_{dry}$ and $T_{wet}$, respectively.

<Polishing Test>

Using each of the polishing pads in Examples and Comparative Example, the polishing processing was performed under the following polishing conditions and the polishing rate was measured. Cu-plated substrates (called the Cu-film substrates, below) were used as workpieces.

(Polishing Rate)

The polishing rate is an amount of polishing per minute expressed in thickness (Å). The thickness of the Cu film on the wafer after polishing was measured at 121 locations, and the average value of the polished thickness was obtained. The polishing rate (Å/min) was determined by dividing the average value of the polished thickness by the polishing time. Here, 37 Cu-film substrates were polished. The first to 35th substrates (workpieces) were polished with polishing pressure of 3.5 psi, the 36th substrate was polished with polishing pressure of 2.9 psi, and the 37th substrate was polished with polishing pressure of 1.5 psi. Here, the polishing pressure represents a pressure component in a vertical direction acting on the substrate during polishing, and this test examined how the polishing rate was changed (pressure responsiveness) by changing the polishing pressure among the three levels.

The polishing rates on the 10th, 20th, and 30th substrates were measured, and a rate of change therebetween was calculated in accordance with the following equation.

Rate of change in polishing rate (%)=(polishing rate on 30-th workpiece−polishing rate on 10th workpiece)/polishing rate on 10th workpiece× 100

Then, the rate of change in the polishing rate was evaluated based on the following criteria.

A: The rate of change in the polishing rate is 2.0% or less
B: The rate of change in the polishing rate is more than 2.0% to 3.5% or less
C: The rate of change in the polishing rate is more than 3.5% to 5.0% or less
D: The rate of change in the polishing rate is more than 5.0%

The results are presented in Table 2.

In addition, the polishing rates on the 35th, 36th, and 37th substrates were measured, and the influence on the polishing rate due to a difference in the polishing pressure (responsiveness to pressure) was examined. The results are presented in FIG. 5.

Note that the thickness measurement was carried out in a DBS mode of an optical film thickness measurement instrument (manufactured by KLA-Tencor Corporation, product number "ASET-F5x").

The polishing conditions used in the aforementioned tests are as follows.

Used polishing machine: F-REX300, manufactured by EBARA CORPORATION
Disk: C100, manufactured by Asahi Diamond Industrial Co., Ltd.
Rotation speed: (Platen) 70 rpm, (Top ring) 71 rpm
Polishing pressure: 3.5 psi (1st to 35th substrates), 2.9 psi (36th substrate), 1.5 psi (37th substrate)
Abrasive material temperature: 20° C.
Abrasive injection rate: 200 ml/min
Work used (workpiece): Cu-plated substrate
Abrasive: a slurry for Cu (CSL-9044C) manufactured by Cabot diluted with water at a mass ratio of 1:9
Polishing time: 60 seconds/batch
Pad break-in condition: 35 N×10 minutes
Conditioning: Ex-situ, 35 N, 4 scans

TABLE 2

| | 10th Substate (Å/min) | 20th Substate (Å/min) | 30th Substate (Å/min) | Rate of Change in Polishing Rate (%) |
|---|---|---|---|---|
| Example 1 | 9042 | 9218 | 9277 | 2.60% (B) |
| Example 2 | 9306 | 9455 | 9593 | 3.08% (B) |
| Example 3 | 9650 | 9637 | 9701 | 0.53% (A) |
| Comparative Example 1 | 8127 | 8420 | 8603 | 5.86% (D) |

Figure 5:
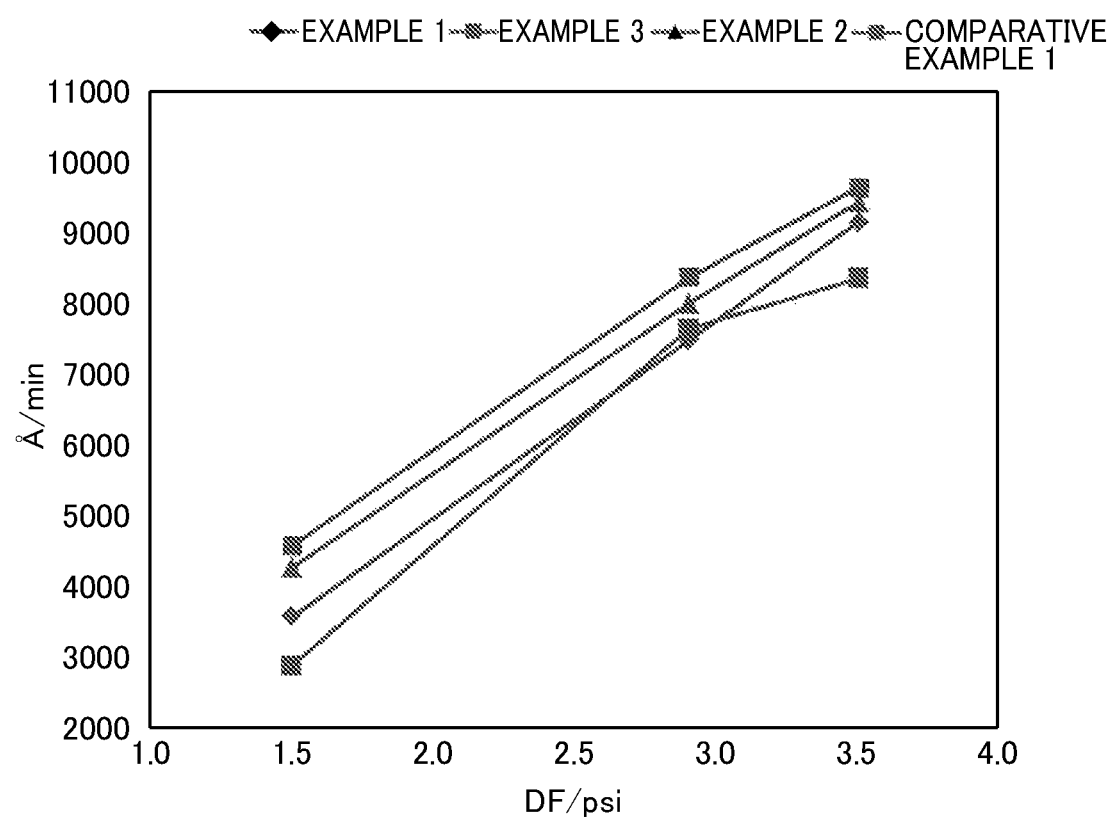
FIG. 5 is a diagram demonstrating polishing rates (Å/min) in the cases of polishing Cu-film substrates by using the polishing pads in Examples 1 to 3 and Comparative Example 1 at polishing pressures of 3.5 psi, 2.9 psi, and 1.5 psi.

The polishing pad in Comparative Example 1 in which the rate of change in the tan δ peak value between the dry state and the wet state was high had a low polishing rate and also had a high rate of change in the polishing rate over time (Table 2). It was also found that when the workpieces were polished using the polishing pad of Comparative Example 1, the polishing rate proportional to the polishing pressure was not obtained, and a sufficient polishing rate failed to be obtained especially when the polishing pressure was high (FIG. 5).

In contrast to this, the polishing pads in Examples 1 to 3 in each of which the rate of change in the tan δ peak value between the dry state and the wet state was low, had a high polishing rate and also had a low rate of change in the polishing rate over time (Table 2). It was also found that when the workpieces were polished using the polishing pads of Examples 1 to 3, the polishing rate proportional to the polishing pressure was obtained, and favorable responsiveness to pressure was demonstrated (FIG. 5).

INDUSTRIAL APPLICABILITY

The polishing pad of the present invention achieves high stability of the polishing rate over time. Therefore, the polishing pads of the present invention and the method for manufacturing the same have industrial applicability.

What is claimed is:

1. A polishing pad comprising a polishing layer including a polyurethane sheet, wherein a rate of change in a tan δ peak value calculated in accordance with the following equation between a loss tangent tan δ peak value (a tan δ peak$_{wet}$) within a temperature range of 20° C. to 100° C. of the polyurethane sheet in a wet state after immersion in a water bath for 3 days in a tensile mode with an initial load of 148 g, a strain range of 0.1%, and a measurement frequency of 1.6 Hz, and a loss tangent tan δ peak value (a tan δ peak$_{dry}$) within a temperature range of 20° C. to 100° C. of the polyurethane sheet in a dry state without immersion in the water bath in a tensile mode with an initial load of 148 g, a strain range of 0.1%, and a measurement frequency of 1.6 Hz is 15% or less:

Rate of change in tan δ peak value=|tan δ peak$_{wet}$−tan δ peak$_{dry}$|/tan δ peak$_{dry}$×100.

2. The polishing pad according to claim 1, wherein a rate of change in a storage elastic modulus calculated in accordance with the following equation between a storage elastic modulus (E'$_{wet}$) of the polyurethane sheet in the wet state at 40° C. in a tensile mode with an initial load of 148 g, a strain range of 0.1%, and a measurement frequency of 1.6 Hz, and a storage elastic modulus (E'$_{dry}$) of the polyurethane sheet in the dry state at 40° C. in a tensile mode with an initial load of 148 g, a strain range of 0.1%, and a measurement frequency of 1.6 Hz is 32% or less:

Rate of change in storage elastic modulus=|E'$_{wet}$−E'$_{dry}$|/E'$_{dry}$×100.

3. The polishing pad according to claim 1, wherein a tan δ peak temperature of the polyurethane sheet in the wet state within a temperature range of 20° C. to 100° C. in a tensile mode with an initial load of 148 g, a strain range of 0.1%, and a measurement frequency of 1.6 Hz is 60 to 100° C., and a tan δ peak temperature of the polyurethane sheet in the dry state within a temperature range of 20° C. to 100° C. in a tensile mode with an initial load of 148 g, a strain range of 0.1%, and a measurement frequency of 1.6 Hz is 60 to 100° C.

4. The polishing pad according to claim 1, wherein the rate of change in the tan δ peak value is 5% or less.

5. The polishing pad according to claim 1, wherein the tan δ peak value of the polyurethane sheet in the wet state is 0.10 to 0.20 and the tan δ peak value of the polyurethane sheet in the dry state is 0.10 to 0.20.

6. The polishing pad according to claim 1, wherein the polyurethane sheet includes hollow bodies with an average particle diameter of 10 to 150 µm.

7. A polishing pad comprising a polishing layer including a polyurethane sheet, wherein a rate of change in a storage elastic modulus calculated in accordance with the following equation between a storage elastic modulus (E'$_{wet}$) at 40° C. of the polyurethane sheet in a wet state after immersion in a water bath for 3 days in a tensile mode with an initial load of 148 g, a strain range of 0.1%, and a measurement frequency of 1.6 Hz, and a storage elastic modulus (E'$_{dry}$) at 40° C. of the polyurethane sheet in a dry state without immersion in the water bath in a tensile mode with an initial load of 148 g, a strain range of 0.1%, and a measurement frequency of 1.6 Hz is 32% or less:

Rate of change in storage elastic modulus=|E'$_{wet}$−E'$_{dry}$|/E'$_{dry}$×100.

8. A method for manufacturing the polishing pad according to claim 1, comprising the steps of:
mixing a polyurethane bond-containing isocyanate compound (A) as a prepolymer and a curing agent (D) to obtain a mixture liquid for molded products; and
molding a polyurethane resin molded product from the mixture liquid for molded products to obtain a polyurethane sheet.

9. The method according to claim 8, wherein the prepolymer contains 2,6-tolylene diisocyanate (2,6-TDI) and/or 2,4-tolylene diisocyanate (2,4-TDI) as a constituent ingredient, and is free of diphenylmethane-4,4'-diisocyanate (MDI).

10. The method according to claim 8, wherein a NCO equivalent of the prepolymer is 440 to 480.

11. The method according to claim 8, wherein the curing agent is 3,3'-dichloro-4,4'-diaminodiphenylmethane and/or polypropylene glycol.

12. A method for manufacturing the polishing pad according to claim 7, comprising the steps of:
mixing a polyurethane bond-containing isocyanate compound (A) as a prepolymer and a curing agent (D) to obtain a mixture liquid for molded products; and
molding a polyurethane resin molded product from the mixture liquid for molded products to obtain a polyurethane sheet.

13. The method according to claim 12, wherein the prepolymer contains 2,6-tolylene diisocyanate (2,6-TDI) and/or 2,4-tolylene diisocyanate (2,4-TDI) as a constituent ingredient, and is free of diphenylmethane-4,4'-diisocyanate (MDI).

14. The method according to claim 12, wherein a NCO equivalent of the prepolymer is 440 to 480.

15. The method according to claim 12, wherein the curing agent is 3,3'-dichloro-4,4'-diaminodiphenylmethane and/or polypropylene glycol.

* * * * *